United States Patent [19]

Yamazaki et al.

[11] Patent Number: 5,644,147

[45] Date of Patent: Jul. 1, 1997

[54] ELECTRO-OPTICAL DEVICE INCORPORATING PIXEL TRANSISTORS WITH PLURAL GATE ELECTRODES

[75] Inventors: Shunpei Yamazaki, Tokyo; Yasuhiko Takemura, Shiga, both of Japan

[73] Assignee: Semiconductor Energy Laboratory Co., Ltd., Kanagawa-ken, Japan

[21] Appl. No.: 498,532

[22] Filed: Jul. 5, 1995

[30] Foreign Application Priority Data

Jul. 7, 1994 [JP] Japan ................... 6-180950

[51] Int. Cl.$^6$ .......................... H01L 31/00; H01L 29/786
[52] U.S. Cl. .............. 257/66; 257/344; 257/350; 257/347; 257/72; 257/365; 257/750; 257/758
[58] Field of Search ............ 257/66, 344, 350, 257/347, 72, 365, 348, 351, 750, 758, 60, 67

[56] References Cited

U.S. PATENT DOCUMENTS

| | | | |
|---|---|---|---|
| 3,823,349 | 7/1974 | Dhaka et al. | 257/758 |
| 4,748,485 | 5/1988 | Vasoden | 257/348 |
| 4,954,855 | 9/1990 | Mimura et al. | 257/347 |
| 5,017,983 | 5/1991 | Wu | 257/66 |
| 5,140,391 | 8/1992 | Hayashi et al. | 257/365 |
| 5,273,921 | 12/1993 | Neudeck et al. | 437/41 |
| 5,338,959 | 8/1994 | Kim et al. | 257/331 |
| 5,339,181 | 8/1994 | Kim et al. | 359/59 |
| 5,367,180 | 11/1994 | Asai et al. | 257/66 |
| 5,430,320 | 7/1995 | Lee | 257/66 |
| 5,444,282 | 8/1995 | Yamaguchi et al. | 257/351 |

FOREIGN PATENT DOCUMENTS

| | | | |
|---|---|---|---|
| 0081869 | 5/1985 | Japan | 257/72 |
| 0005661 | 1/1987 | Japan | 257/72 |

OTHER PUBLICATIONS

4:3: High–Aperture And Fault–Tolerant Pixel Structure For TFT–LCDs, S.S. Kim, S.H. Moon, D.G. Kim, N.D. Kim, Samsung Electronics, Kyungki–do, Korea, SID 95 Digest, pp. 15–18.

*Primary Examiner*—Sara W. Crane
*Assistant Examiner*—David B. Hardy
*Attorney, Agent, or Firm*—Sixbey Friedman Leedom & Ferguson; Gerald J. Ferguson, Jr.; Evan R. Smith

[57] ABSTRACT

A thin film transistor (TFT) has first (lower) and second (upper) gate electrodes which are provided respectively above and under a semiconductor active layer and first and second insulating films (which serve as gate insulating films) provided respectively between the first gate electrode and a semiconductor layer and between a second gate electrode and the semiconductor layer. The second gate electrode has an anodic oxide film made of a material constituting the gate electrode on the upper and side surfaces thereof formed by anodization. Also, a silicide region is provided by covering the source/drain regions of the TFT with a silicide and changing a part of the region into a silicide.

18 Claims, 6 Drawing Sheets

ELECTRO-OPTICAL DEVICE INCORPORATING PIXEL TRANSISTORS WITH PLURAL GATE ELECTRODES

BACKGROUND OF THE INVENTION

1. Field of the Invention

The present invention relates to an insulated gate type transistor (thin film transistor, TFT) formed on an insulating surface of an insulating material such as glass or a silicon wafer having an insulating film of silicon oxide or the like formed thereon and a method for producing the same and, in particular, to a semiconductor device such as an integrated circuit on which a plurality of such TFTs are formed. A TFT of the present invention has an active layer constituted by a crystalline semiconductor such as an amorphous or polycrystalline semiconductor. Although the present invention is effective especially for TFTs formed on a glass substrate having glass transition point (referred to as strain temperature or strain point) of 750° C. or lower, it may be applied to TFTs formed on a glass substrate having a higher melting point or an insulating film formed on a single crystal semiconductor wafer. Semiconductor devices of the present invention may be used for an active matrix type liquid crystal display device or the like, a driving circuit such a an image sensor, or a three-dimensional integrated circuit having many integrated circuit layers.

2. Description of the Related Art

It has been well known that TFTs are formed for driving an active matrix type liquid crystal display device, an image sensor, and the like. For such TFTs, a film-like semiconductor deposited by a vapor phase growing process such as CVD (chemical vapor deposition) and sputtering is used as it is or used after being subjected to an annealing process such as heat annealing and laser annealing. Most semiconductors obtained through such process are in an amorphous or polycrystalline state.

With the advent of devices having long gate lines such as high capacity matrices in recent years, the resistance of such gate lines has created problems such as delay in signals and distortion of pulses. Also, semiconductors used as an active layer (channel forming region) have a problem in that an unwanted channel is formed in an area where no gate electrode is provided (e.g., the bottom side of a top gate type semiconductor and the top side of a bottom gate transistor) because such semiconductors are in a non-single crystalline state, which results in a leakage current. Further, high sheet resistance at the source and drain has become significant especially when an amorphous semiconductor is used.

SUMMARY OF THE INVENTION

It is an object of the present invention to solve one or all of such problems.

A thin film transistor (TFT) of the present invention has first (lower) and second (upper) gate electrodes which are provided respectively above and under a semiconductor active layer and first and second insulating films (which serve as gate insulating films) provided respectively between the first gate electrode and a semiconductor layer and between a second gate electrode and the semiconductor layer. The second gate electrode has an anodic oxide film made of a material constituting the gate electrode on the upper and side surfaces thereof formed by anodization.

For this reason, the second gate electrode must be formed of a material which can be anodized such as metals mainly composed of aluminum, titanium, and tantalum. Such metals may be alloys. Unless otherwise stated, the term "aluminum" used in this specification includes not only pure aluminum but also aluminum containing additives of 10% or less. This applies also to other metals such as titanium.

In the present invention, the first gate electrode is always kept at the same electric potential as that of the second gate electrode. For this purpose, the first gate electrode must have a contact to electrically connect it to the second electrode. A contact hole is formed in a line extending from the first electrode (a first gate line) by etching the first and second insulating films.

The present invention is further characterized in that the first gate electrode and the second gate electrode are formed so that they substantially overlap each other. However, some part of the second gate electrode may not extend above the first gate electrode, and vice versa. The first and second gate lines produce a large step where they overlap. Where those gate lines intersect with a line in the layer above them, the breakage of lines at such an intersection will be effectively prevented by a design of the intersection wherein the overlying line intersects with only one of the gate lines to reduce the size of the step across which the line extends.

In the present invention, a source and a drain which are formed on a self-alignment using the second gate electrode and the anodic oxide on the side surface thereof as masks. The source and the drain are formed by a method such as ion doping utilizing irradiation with accelerated impurity ions, thermal diffusion, and laser diffusion.

Also, a TFT of the present invention has a silicide region provided by covering the source/drain regions with a silicide or changing a part of the region into a silicide. Especially, TFTs using an amorphous semiconductor have a sheet resistance as very high as 10 KΩ/square because source/drain regions are constructed from an amorphous material or an equivalent material. However, the silicide provided in this region results in a substantial sheet resistance of 1000 Ω/square or less or 100 Ω/square or less under a more preferable condition.

In the present invention, it is important for a step of providing the silicide that the second gate electrode is covered with an anodic oxide. The silicide is provided as follows.

The second insulating film is etched using the second gate electrode covered with an anodic oxide as a mask to expose the semiconductor active layer. A metal film for forming the silicide is formed. When a silicon semiconductor is used, the metal material for forming the silicide is preferably a material which allows the silicide to be in ohmic contact or near ohmic low resistance contact with N-type or P-type silicon. For example, appropriate materials include molybdenum (Mo), tungsten (W), platinum (Pt), chromium (Cr), titanium (Ti), and cobalt (Co). At this stage, the exposed portion of the semiconductor active layer is in tight contact with the above metal film.

A portion of the semiconductor active layer in tight contact with the metal film is changed into a silicide by performing heat annealing or irradiating the portion with a laser beam or a beam having similar intensity. On the other hand, metal films are formed on the anodic oxide and the insulating film as well as the semiconductor laser. However, the metal films formed in such areas do not react with those materials.

The metal films which have not reacted are removed. If the process described so far is performed without the anodic oxide covering the second gate electrode, a problem arises in that the metal film formed to be changed into a silicide not only react with the gate electrode material but can even etch the gate electrode during the step of removing it. It will be understood that the anodic oxide prevents the reaction between the metal films and the gate electrode and serves as an etching stopper.

The anodic oxide also has a function of preventing the silicide on the source/drain regions from shorting with the gate electrode. Specifically, since the silicide is provided to substantially cover the entire surface of the source/drain regions, it is consequently in proximity to the gate electrode. Although the source/drain regions are separated from the gate electrode by the gate insulating film, the silicide is very much likely to contact the gate electrode because it is formed after the gate insulating film on the source/drain regions is once removed. However, if an anodic oxide is provided on the side surfaces of the gate electrode, it is possible to prevent the silicide from contacting the gate electrode. In addition, since an anodic oxide can be formed to be very dense and preferable in insulation characteristics, the possibility of shorting is suppressed to a very low degree.

Typical steps for obtaining TFTs or an integrated circuit of the present invention are as follows.

At the first step, a first gate line is formed on an insulated surface. Although the first gate line is preferably formed of a heat resistant material such as silicon, molybdenum, and tungsten, other materials may be used. Further, the first gate line may be covered with an anodic oxide on its surface.

The second step is to form a first insulating film covering the first gate line, as a gate insulating film for a first gate electrode. When silicon is used as the semiconductor, for example, silicon nitride, silicon oxide, silicon oxide nitride ($SiO_xN_y$) or the like may be used. The insulating film may be constituted by either a single layer or multiple layers.

The third step is to form an island-shaped semiconductor layer on the first insulating film. The semiconductor layer may be either amorphous or crystalline. Localized annealing such as laser annealing will allow a configuration wherein a crystalline semiconductor is formed on a particular portion of the substrate and an amorphous semiconductor is formed on other portions.

The fourth step is to form a second insulating film on the semiconductor layer, as a gate insulating film for a second gate electrode. When silicon is used as the semiconductor, for example, silicon nitride, silicon oxide, silicon oxide nitride ($SiO_xN_y$) or the like may be used. The insulating film may be constituted by either a single layer or multiple layers.

The fifth step is to form contact holes in the first gate line by etching the first and second insulating films. The number of the contact holes depends on the type of the integrated circuit and is preferably one or two for one TFT.

The sixth step is to form a second gate line which covers the second insulating film and contact holes. The second gate line is substantially parallel with the first gate line and is preferably in the same shape as the first gate line. The second line may be omitted at an intersection with a third line to be described later to moderate the step formed in such a place.

The seventh step is to supply a current to the second gate line in an electrolytic solution to form anodic oxides on the side and upper surfaces of the second gate line. At least one of the anodic oxides formed at this step is preferably a so-called barrier type anodic oxide. A barrier type anodic oxide is an anodic oxide obtained as a resulted of anodization in a substantially neutral electrolytic solution and is characterized in that the voltage applied is increased as the growth of the anodic oxide proceeds.

The eighth step is to introduce N- or P-type impurities into the above semiconductor layer on a self-alignment using the second gate line and the anodic oxides on the side surfaces thereof as masks. The second insulating film may be etched prior to the introduction of impurities to expose the semiconductor layer. If ion doping is employed, impurities may be implanted through the second insulating film. In ion doping or the like, impurities must be activated by annealing process such as heat annealing and laser annealing. A silicide may be formed before or after the implantation of impurities.

The ninth step is to form a third line which is connected to at least either the source or drain formed on the semiconductor layer or to the silicide.

In the present invention, the gate line may be constituted by two layers. This makes it possible to suppress the resistance of the gate line as a whole to a value lower than that of a gate line constituted by a single layer. Specifically, in the prior art wherein a gate electrode is constituted by a single layer, the thickness of the gate line must be increased to reduce the resistance of the gate line. For example, a normal gate electrode of the prior art has a thickness of 3000 to 5000 Å. Such a thickness must be doubled for gate lines for a large capacity matrix which must have low resistance.

However, an increase in the thickness of a single layer gate line increases the size of the step formed by the gate line, this makes it difficult for an insulating film formed thereon to sufficiently cover the gate electrode and gate line. Especially, when an insulating film is formed by CVD such as plasma CVD at the substrate temperature of 420° C. or lower, a rapid degradation of coverage characteristics occurs when the size of the step exceeds 5000 Å, resulting in interlayer shorting and the like.

In the present invention, although the combined thickness of the upper and lower gate lines are sufficiently large, the above problems can be avoided because each gate line is sufficiently covered by an insulating film.

In the prior art, breakage in only one place of a gate line leads to a line failure that all elements in the row connected to the line cannot be operated. In the present invention, the gate lines in the upper and lower layers extend with contacts formed thereon at appropriate intervals. As a result, there is no reduction in the yield of products due to breakage in gate lines.

Further, in the invention, gate electrodes are provided above and under an active layer. This eliminates the possibility of formation of unwanted channels in the active layer on the side opposite to the gate electrodes, resulting in a reduction in leakage current.

In this regard, the present invention is advantageous especially for a semiconductor active layer whose crystallinity is different on the upper and lower sides thereof. It is well known that, in general, a crystal of a crystalline silicon semiconductor grows from the lower portion of the semiconductor. The characteristics of the interface between a crystalline silicon and an insulating film is better on the lower side of the silicon than on the upper side. Therefore, it is preferable to provide gate electrodes on the lower side of the silicon.

In addition, a silicide region provided adjacent to a source/drain regions according to the present invention has a effect of reducing the sheet resistance.

In the present invention, TFTs may be irradiated by light especially in devices which are irradiated by external light such as liquid crystal displays and image sensors. In this case, the light irradiated to the active layer from the side of the gate electrodes is blocked by the gate electrodes and, hence, does not adversely affect the characteristics of the TFTs. However, the light irradiated from the side where no gate electrode is provided generates a photoelectric current which significantly degrades the TFT characteristics. Also, light is not irradiated in only one direction in general, and it has not been possible to control a very small amount of light generated as a result of scattering. A common solution to this problem is to form a shading film on the side opposite to gate electrodes. In the present invention, however, gate electrodes are provided above and under the active layer, which serve as shading films to prevent light from entering the active layer.

In the present invention, it is possible to choose either a first gate electrode or a second gate electrode of a TFT as a dominant electrode of the TFT by adjusting the thickness and dielectric constants of first and second gate insulating films. Specifically, the first electrode plays the major role in the operation of the TFT if the first and second gate insulating films are formed of the same insulating material and the first insulating film is made thinner than the second gate insulating film. The second gate electrode will be dominant if the gate insulating films are arranged in the reverse way. The decision on which of the first and second gate electrodes is to be dominant may be made comparing the characteristics of the interface between the active layer and the first insulating film and the interface between the active layer and the second insulating film.

There are several variations of the integrated circuit according to the present invention. For a monolithic active matrix circuit constituted by an active matrix circuit and peripheral circuits for driving the same which can be regarded as circuits of the same kind (an active matrix circuit integrated with peripheral circuits), a structure may be proposed as a first variation wherein top-gate type TFTs are used for the peripheral circuits and TFTs of the present invention is used for the active matrix circuit. In this case, the leakage current of the TFTs for the matrix circuit can be reduced, and the parasitic capacity of the peripheral circuits can be reduced because the source/drain regions of those circuits can be formed on a self alignment.

A second variation is to construct the peripheral circuits using a crystalline semiconductor and to construct the active matrix circuit using an amorphous semiconductor. In general, a TFT utilizing a crystalline semiconductor has a high operating speed and a TFT utilizing an amorphous semiconductor has less leakage current. The former is suitable for peripheral circuits and the latter is suitable for an active matrix circuit.

BRIEF DESCRIPTION OF THE DRAWINGS

FIGS. 1(A) to 1(I) are a method of manufacturing TFTs according to a first embodiment of the present invention;

FIGS. 2(A) to 2(I) are a method of manufacturing TFTs according to a first embodiment;

FIGS. 3(A) to 3(I) are a method of manufacturing TFTs according to a second embodiment;

FIGS. 4(A) to 4(C) show the structure of a TFT circuit according to the first embodiment;

FIGS. 5(A) to 5(C) show the structure of a TFT circuit according to the first embodiment;

DETAILED DESCRIPTION OF THE PREFERRED EMBODIMENTS

[Embodiment 1]

Figure 6:
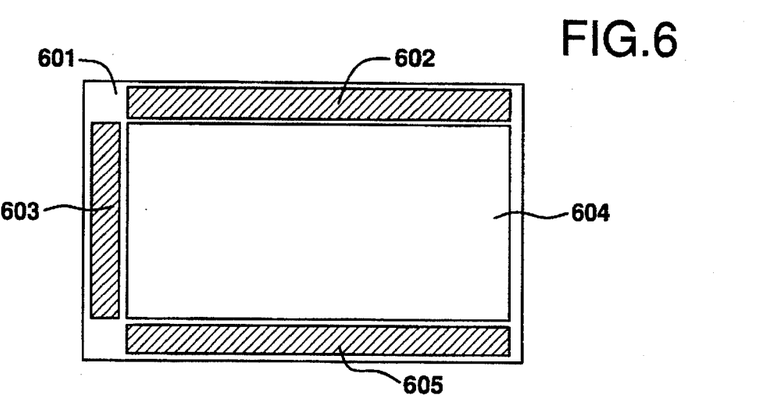
FIG. 6 is a block diagram of a monolithic active matrix circuit.

A first embodiment will be described with reference to FIGS 1(A) to 1(I), FIGS. 2(A) to 2(I), and FIGS. 4(A) to 4(C). The embodiment shows steps of manufacturing a monolithic active matrix circuit and the structure of the same. A monolithic active matrix circuit has a block configuration as shown in FIG. 6 wherein an active matrix circuit region 604, a data driver circuits 602 and 605 surrounding the region 604, and a scan driver circuit 603 are provided on a single substrate 601. The data driver circuit and the scan driver circuit may be provided in any quantities other than those shown in FIG. 6. The data driver circuit, scan driver circuit, and other auxiliary driving circuits are collectively referred to as a peripheral circuit. In a peripheral circuit, a complementary MOS circuit is constructed using a P-channel TFT and an N-channel TFT. Therefore, FIGS. 2(A) to 2(I) show steps of manufacturing an invertor circuit constituted by a complementary MOS circuit.

Figure 4A:
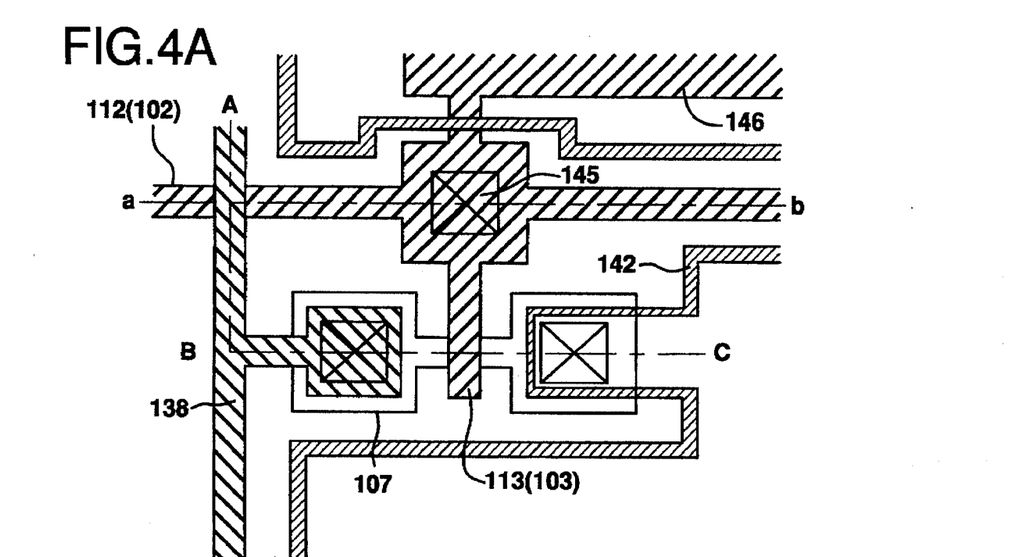

FIGS 1(A) to 1(I) are a sectional view of a typical portion of an active matrix circuit region. FIGS. 2(A) to 2(I) are a sectional view of a typical portion of a peripheral circuit region. FIGS 1(A) to 1(I) and FIGS. 2(A) to 2(I) represent corresponding process steps, and like reference symbols in FIGS 1(A) to 1(I), FIGS. 2(A) to 2(I), and FIGS. 4(A) to 4(C) represent the same. A matrix circuit viewed from the side of the top thereof is shown at FIG. 4(A). FIGS 1(A) to 1(I) show a sectional view taken along the line A-B-C at FIG. 4(A). A circuit diagram of an active matrix circuit manufactured by the present embodiment is shown at FIG. 4(C). The manufacturing steps according to the present embodiment will be described with reference to FIGS 1(A) to 1(I) and FIGS. 2(A) to 2(I)

Figure 1A:
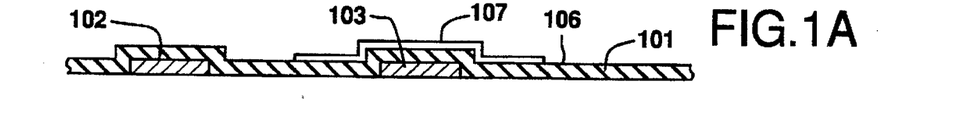

Gate line/electrodes 102, 103, 104, and 105 are formed on an insulating surface 101 of a substrate (Corning 7059, 100 mm×100 mm) having a 1000 Å thick silicon nitride film formed thereon (not shown). The gate line/electrodes are formed by etching a polycrystalline silicon film having a thickness of 3000 Å whose resistance has been reduced by doping it with phosphorus. The polycrystalline silicon film is formed by low pressure CVD. The film is in a polycrystalline state.

In stead of the above method, the polycrystalline film may be obtained by a method wherein an intrinsic amorphous silicon film is formed by plasma CVD or low pressure CVD; impurities such as phosphorus are introduced into the film by ion doping or the like; and the film is thermally annealed at 500° to 600° C. An element which promotes crystallization such as nickel may be added in a very small amount during the annealing.

Although silicon is used in the present embodiment, a silicified metal may be instead.

A silicon nitride film 106 having a thickness of 3000 to 6000 Å, e.g., 4000 Å is deposited as a gate insulating film by plasma CVD. Then, an amorphous silicon film having a thickness of 300 to 1000 Å, e.g., 500 Å is formed by plasma CVD, and then etched to form island-like regions 107, 108, and 109 (see FIG. 1(A) and FIG. 2(A)).

A silicon nitride film 110 having a thickness of 3000 to 6000 Å, e.g., 2000 Å is deposited by plasma CVD as a gate insulating film. In this state, only the portion of peripheral circuits is irradiated by a laser to crystallize the island-like silicon films. An XeCl excimer laser (wavelength: 308 nm) is used. The energy density and the number of pulses of the irradiation laser are adjusted depending on the characteristics of the silicon film and the silicon nitride film 110.

Although not shown, the silicon nitride films 110 and 106 are etched to form contact holes which extend to reach the first gate lines. The contact holes are provided to form contact between the first gate lines and second gate line formed on the first gate lines. They correspond to a contact 145 shown at FIGS. 4(A) and 4(B).

Figure 1B:
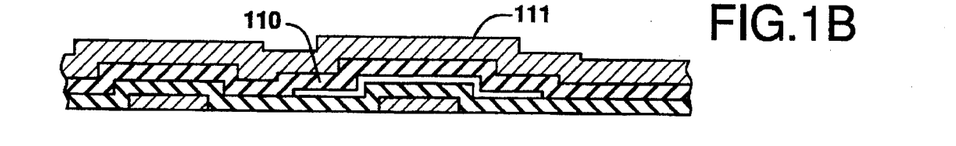
Figure 2A:
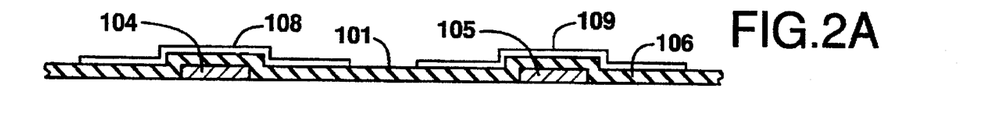
Figure 2B:
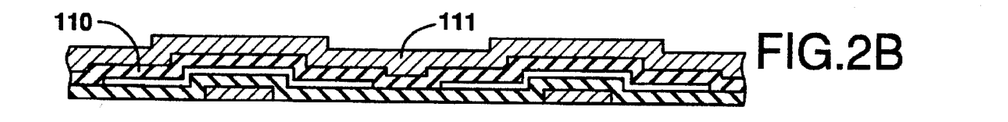

After the contact holes are formed, an aluminum film 111 having a thickness of 3000 to 8000 Å, e.g., 5000 Å is formed by sputtering. Generation of hillock can be effectively suppressed by adding scandium (Sc) of 0.1 to 0.5% by weight to the aluminum film (see FIG. 1(B) and FIG. 2(B)).

Figure 1C:
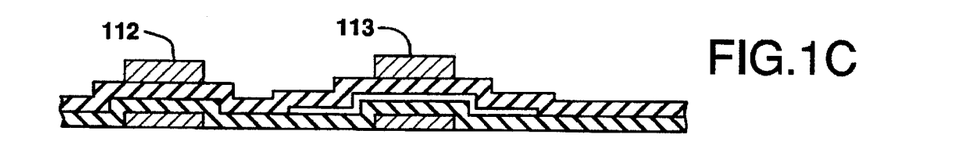

Next, the aluminum film is etched to form second gate line/electrodes 112, 113, 114, and 115. As a result, contact is formed between the first and second gate lines through the contact holes formed as described above.

Figure 2C:
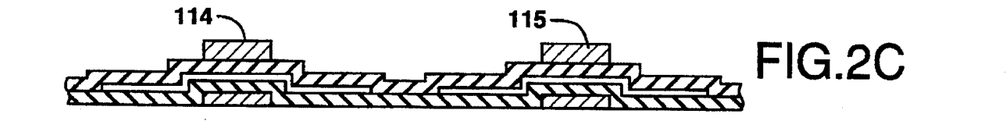

In this case, the design must be carried out so that the contact holes are completely covered by the second gate lines. The reason is that if the first gate lines made of silicon are exposed at the contact holes, current can flow through such exposed portions and anodization do not proceeds, during an anodization to be performed later (see FIG. 1(C) and FIG. 2(C)).

Figure 1D:
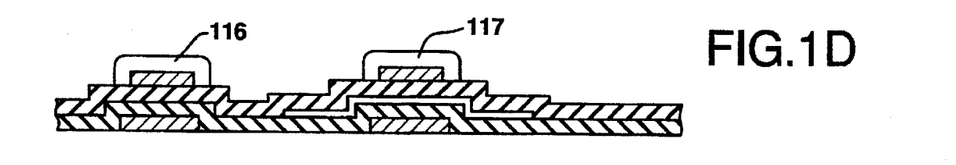
Figure 2D:
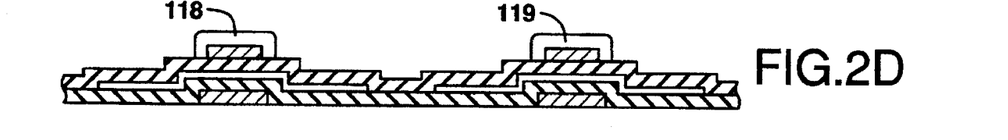

Then, current is applied to the gate electrodes in an electrolytic solution. The solution used at this step is an ethyleneglycol solution obtained by adding ammonia to 3 to 10% tartaric acid to adjust the pH to 6.8 to 7.2. A preferable oxide film is obtained when the solution is at about 10° C. which is lower than the room temperature. Thus, barrier type anodic oxides 116, 117, 118, and 119 are formed on the upper and side surfaces of the second gate line/electrodes. The thickness of the anodic oxides is proportionate to the applied voltage. A voltage of 150 V results in the formation of anodic oxides having a thickness of 2000 Å. The preferred thickness of the anodic oxides is 1000 to 3000 Å. To obtain anodic oxides with a thickness of 3000 Å or more, a high voltage of 250 V or more must be applied, which is undesirable because TFT characteristics can be adversely affected (see FIG. 1(D) and FIG. 2(D)).

Figure 1E:
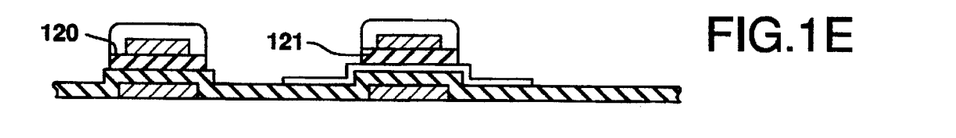
Figure 2E:
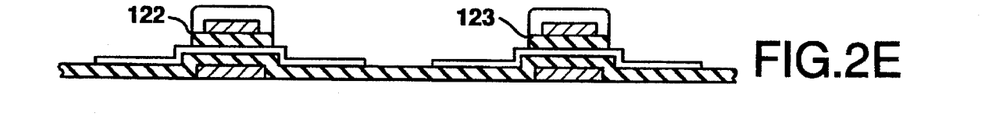

Thereafter, dry etching is performed to etch the silicon nitride film 110. At this time, since the anodic oxides are not etched, the silicon nitride film 110 is etched on a self-alignment to remain gate insulating films 120, 121, 122, and 123 between the gate lines/electrodes and the island-like silicon layers (see FIG. 1(E) and FIG. 2(E)).

Figure 1F:
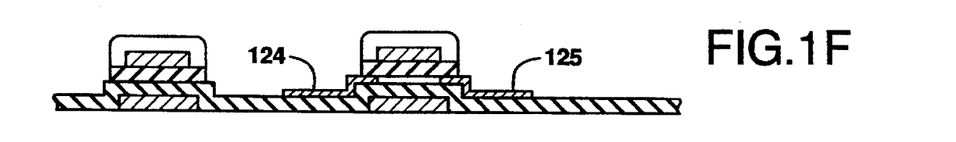
Figure 2F:
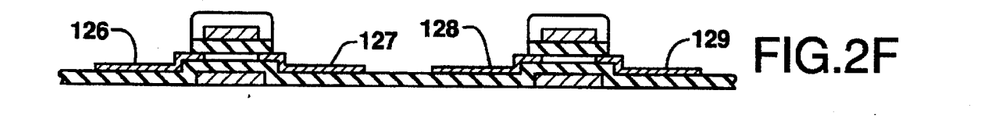

Then, ion doping is performed to implant N-type and P-type impurities on a self-alignment into the island-like silicon layers 107, 108, and 109 using the gate electrode portion (the gate electrodes and anodic oxide films around them) as a mask. Thus, N-type impurity regions (source/drain regions) 124, 125, 126, and 127 and P-type impurity regions 128 and 129 are formed. Phosphine ($PH_3$) is used for the doping of N-type impurities while diborane ($B_2H_6$) is used for the doping of P-type impurities. The dose is $5 \times 10^{14}$ to $5 \times 10^{15}$ atoms/cm$^2$, and the acceleration energy is 10 to 30 keV. Thereafter, a KrF excimer laser beam having a wavelength of 248 nm and a pulse width of 20 nsec. is irradiated to the active layer to activate the impurity ions introduced therein (see FIG. 1(F) and FIG. 2(F)).

Figure 1G:
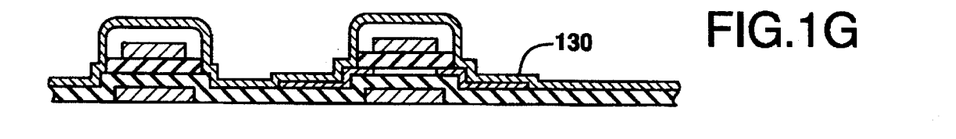
Figure 2G:
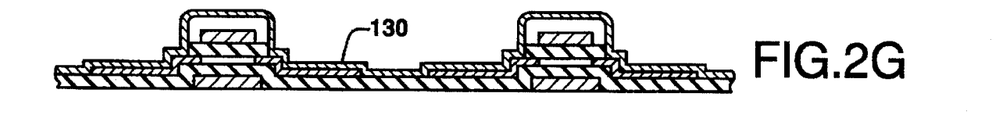

Then, an appropriate metal film, e.g., a titanium film 130 having a thickness of 50 to 500 Å, is formed on the entire surface by sputtering (see FIG. 1(G) and FIG. 2(G)).

Next, heat annealing is performed at 450° to 550° C., e.g., 500° C., for 10 to 60 minutes to cause a reaction between titanium and silicon, to form silicide (titanium silicide) regions 131, 132, 133, 134, 135, and 136. The doped impurities are further activated during this annealing.

Instead of heat annealing, silicification may be carried out through lamp annealing utilizing irradiation with laser light, visual light, or near ultraviolet light.

Figure 1H:
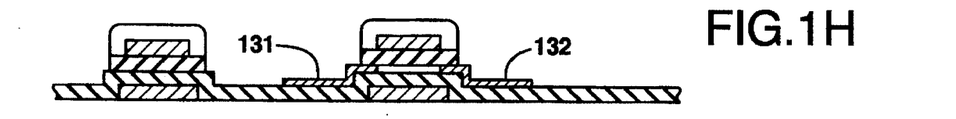
Figure 2H:
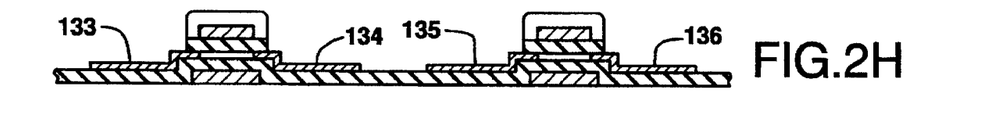

Then, the Ti film is etched using an etchant obtained by mixing hydrogen peroxide, ammonia, and water in a ratio of 5:2:2. The titanium film in areas other than those in contact with the exposed active layer (e.g., the areas of the titanium film above the silicon nitride film 106 and anodic oxide films) can be removed by this etching process because it has remained in a metallic state in such areas. On the other hand, titanium silicide can be left in place because it is not etched (see FIG. 1(H) and FIG. 2(H)).

Further, a silicon oxide film having a thickness of 5000 Å is formed as a first interlayer insulator 137 on the entire surface by CVD. Then, contact holes are formed at the source/drain regions of the TFTs. After the first interlayer insulator is formed, annealing is performed at 400° C. for 10 to 30 minutes. Thereafter, aluminum line/electrodes 138, 139, 140, and 141 are formed. Further, a pixel electrode 142 is formed from an ITO film. Finally, a silicon nitride film 143 is formed by plasma CVD to a thickness of 2000 to 5000 Å, e.g., 3000 Å, to prevent external moisture, movable ions and the like from entering the TFTs, and a pixel portion 144 is opened to expose the ITO film (see FIG. 1(I) and FIG. 2(I)).

Figure 1I:
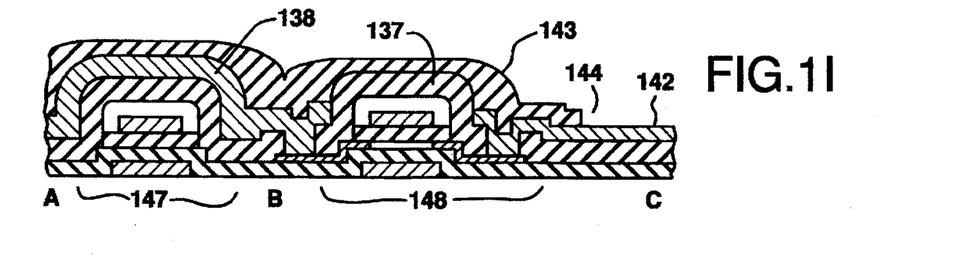
Figure 2I:
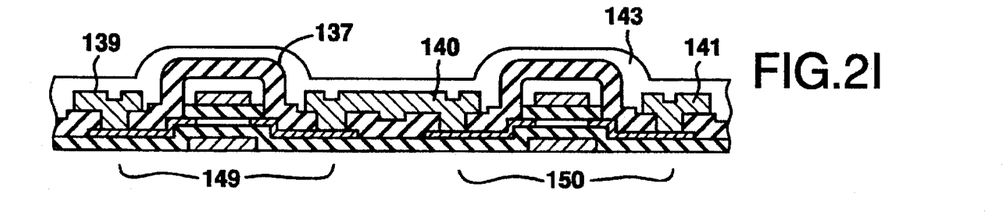

Thus, a line intersection 147, a TFT 148 connected to a pixel, and an N-channel type TFT 149 and a P-channel type TFT 150 for peripheral circuits are completed to complete a monolithic active matrix circuit.

Figure 4B:
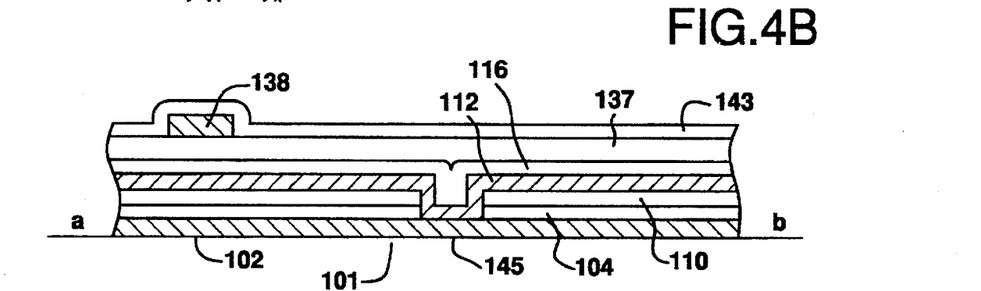

The top view of the TFT provided in a pixel portion according to the present embodiment is shown at FIG. 4(A). Although FIGS. 4(A) to 4(C) show the gate line extending from the scan driver as a single line, a first gate line 102 is formed under a second gate line 112 in parallel. The first gate line 102 and the second gate line 112 are connected at the contact 145. The active matrix circuit in the present embodiment has one contact 145 for one TFT.

Such an arrangement makes it possible to prevent a row in the matrix from failing even if either the upper or lower gate line for the row is broken. In the present embodiment, the contact 145 is provided at an area where the gate lines are branched as shown at FIG. 4(A). The reason is that it is advantageous to provide pad regions (thick regions of the lines) for forming the contact 145 in such a portion from the viewpoint of layout because no extra space is required for such a purpose.

There is shown at FIG. 4(B) a sectional structure of the gate lines along the line a-b at FIG. 4(A). A circuit diagram of a matrix obtained by arranging a plurality of the circuits at FIG. 4(A) is shown at FIG. 4(C).

It is shown at FIG. 4(A) that the gate lines 112 and 102 are branched to a line 146 which extends under the pixel electrode for the row above the row associated with the gate lines. This line 146 establishes a capacity with the pixel electrode and is provided in parallel with the capacity of the liquid crystal formed by the pixel electrode in the circuit.

[Embodiment 2]

A second embodiment of the present invention will now be described with reference to FIGS. 2(A) to 2(I), FIGS. 3(A) to 3(I), and FIGS. 5(A) to 5(C). The present embodiment will address steps of manufacturing a monolithic active matrix circuit and the structure of the same. Although the present embodiment addresses a method of manufacturing an active matrix circuit, the same process as explained in this embodiment equally applies to peripheral circuits for a monolithic active matrix circuit.

FIGS. 3(A) to 3(I) are a sectional view of an active matrix circuit. Like reference numbers in FIGS. 3(A) to 3(I) and FIGS 5(A) to 5(C) indicate like elements. A top view of a completed matrix circuit is shown at FIG. 5(A), and FIGS. 2(A) to 2(I) show a section taken along the line A-B-C shown at FIG. 5(A). There is shown at FIG. 5(C) a circuit diagram of an active matrix circuit manufactured according to the present embodiment. The manufacturing steps according to the present embodiment will be described with reference to FIGS. 3(A) to 3(I).

Figure 3A:
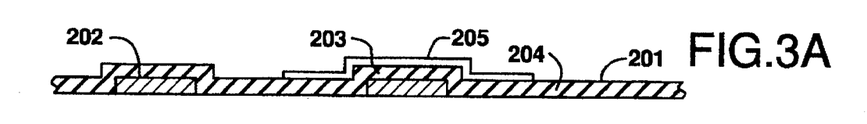

First gate line/electrodes 202 and 203 are formed on an insulating surface 201 of a substrate (Corning 7059, 100 mm×100 mm) having a 1000 Å thick silicon nitride film formed thereon (not shown). The gate line/electrodes are formed by etching a 3000 Å thick tungsten film formed by sputtering. A heat resistant metal such as molybdenum and titanium may be used instead of tungsten.

A silicon nitride film 204 having a thickness of 3000 to 6000 Å, e.g., 4000 Å is deposited by plasma CVD as a gate insulating film. An amorphous silicon film having a thickness of 300 to 1000 Å, e.g., 500 Å is formed by plasma CVD and then added with a very small amount of nickel and is crystallized by annealing it at 500° to 580° C., e.g., 550° C. Further, the silicon film is irradiated with a laser beam to increase the crystallinity thereof. An XeCl excimer laser having a wavelength of 308 nm is used. The energy density and the number of pulses of the irradiation laser are adjusted depending on the characteristics of the silicon film. The silicon film is then etched to form an island-like region 205 (see FIG. 3(A)).

Further, a silicon oxide film 206 having a thickness of 3000 to 6000 Å, e.g., 1000 Å is deposited by plasma CVD. This film also serves as a gate insulating film.

Figure 3B:
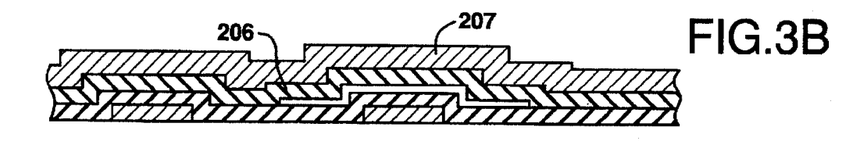

Although not shown, the silicon nitride films 204 and silicon oxide film 206 are then etched to form contact holes which extend to reach the first gate lines. The contact holes correspond to contacts 223 and 224 shown at FIG. 5(A) and 5(B). After the contact holes are formed, an aluminum film 207 having a thickness of 3000 to 8000 Å, e.g., 5000 Å is formed by sputtering (see FIG. 3(B).

Figure 3C:
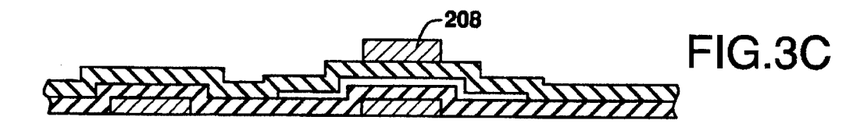

Next, the aluminum film is etched to form second gate line/electrodes 208, 221, and 222. In the present embodiment the second gate line is not formed in the area on which a source line extending from a driver is formed (the area of the first gate line 202 shown at FIG. 3(C)). (See FIG. 5(A) for the gate lines 221 and 222.)

As a result, contact is established between the first and second gate lines through the contact holes 223 and 224 formed as described above. In the present embodiment, since the second gate line is not provided in the area where the source line 216 is present as described above, the contact holes are provided in two positions on both sides of the source line. That is, two contacts are formed for one TFT (see FIG. 3(C)).

Figure 3D:
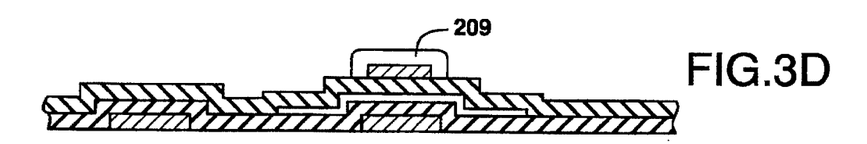

Current is supplied to the gate electrodes in an electrolytic solution to perform anodization as in the first embodiment, so that a barrier type anodic oxide 209 is formed on the upper and side surfaces of the second gate line/electrode 208. The thickness of the anodic oxide is 1500 Å (see FIG. 3(D)).

Figure 3E:
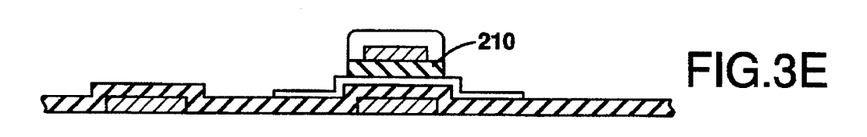

Thereafter, wet etching is performed to etch the silicon oxide film 206. The etchant is a solution obtained by mixing hydrofluoric acid, aluminum fluoride, and acetic acid. This etchant is characterized in that its etching rate is high especially for a silicon oxide film formed by plasma CVD and is sufficiently low for aluminum oxide, silicon, and silicon nitride. Therefore, only the silicon oxide film 206 can be selectively etched on a self alignment basis using the gate electrode portion (the gate electrodes and anodic oxide films around them) as a mask. A gate insulating film 210 remains between the gate line/electrodes and the island-like silicon layer (see FIG. 3(E)).

Figure 3F:
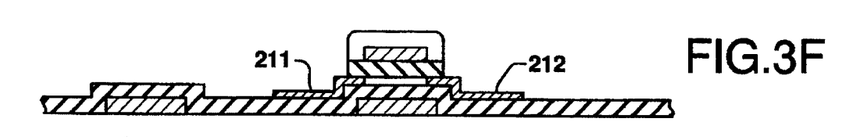

Next, source/drain regions 211 and 212 are formed by ion doping wherein P-type impurities are implanted into the island-like silicon layer 205 on a self-alignment using the gate electrode portion as a mask. The dose is $1\times10^{14}$ to $5\times10^{15}$ atoms/cm$^2$, for example, $2\times10^{14}$ atoms/cm$^2$, and the acceleration energy is 10 to 30 keV, for example, 20 keV. Thereafter, a KrF excimer laser beam having a wavelength of 248 nm and a pulse width of 20 nsec. is irradiated to the active layer to activate the impurity ions introduced therein (see FIG. 3(F)).

Figure 3G:
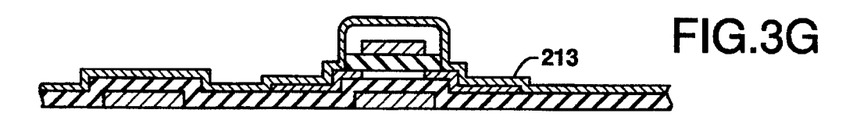

Then, a titanium film 213 having a thickness of 50 to 500 Å, is formed on the entire surface by sputtering (see FIG. 3(G)).

Figure 3H:
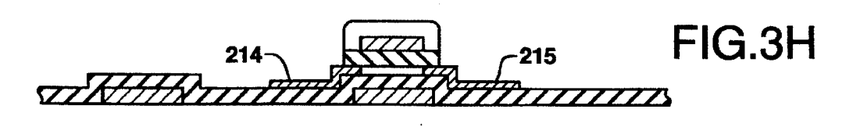

Next, heat annealing is performed at 450° to 550° C., e.g., 500° C., for 10 to 60 minutes to cause a reaction between titanium and silicon, to form silicide (titanium silicide) regions 214 and 215. The Ti film which has not been subjected to the reaction is etched using an etchant obtained by mixing hydrogen peroxide, ammonia, and water in a ratio of 5:2:2 (see FIG. 3(H)).

Thereafter, an aluminum line/electrode 216 which serves as a source line is formed. In the present embodiment, since the second gate line is not provided in the portion wherein the source and gate lines intersect with each other, the first insulating film (silicon nitride having a thickness of 4000 Å) 204 can be used as an interlayer insulator. As a result, the number of the film forming steps can be reduced compared to the first embodiment. Further, a silicon nitride film 217 is formed by plasma CVD to a thickness of 2000 to 5000 Å, e.g., 3000 Å in order to prevent external moisture, movable ions and the like from entering the TFTs. Finally, a pixel electrode 218 is formed from an ITO film (see FIG. 3(I)).

Figure 3I:
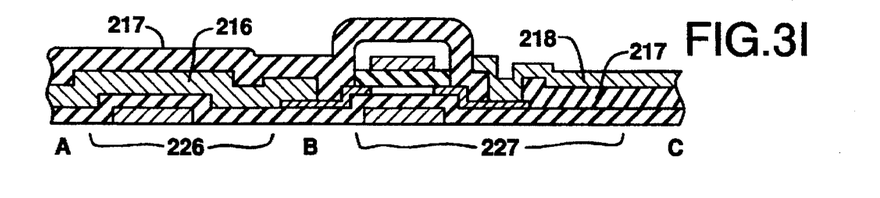

Thus, a line intersection 226 and a TFT 227 connected to a pixel in an active matrix circuit are completed.

Figure 5A:
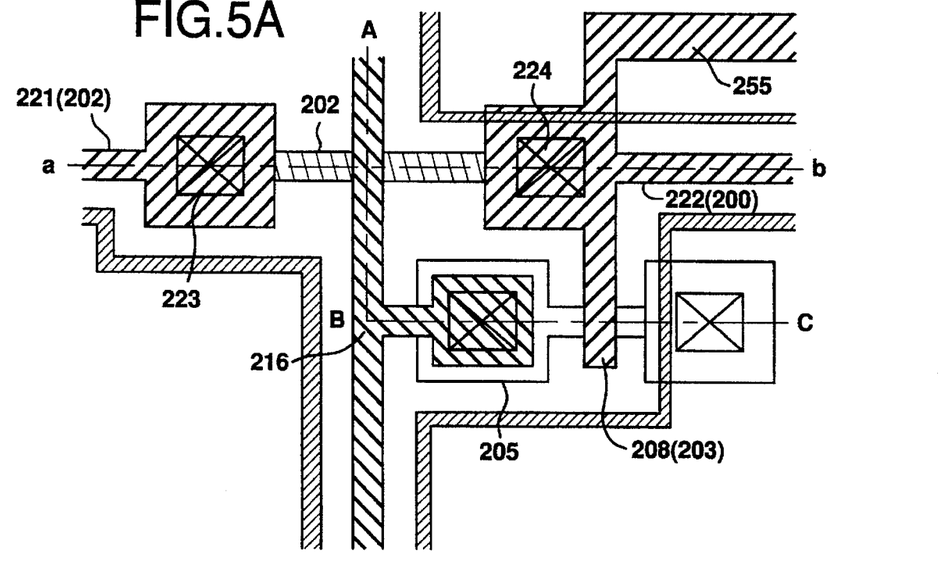

The top view of the TFT provided in a pixel portion according to the present embodiment is shown at FIG. 5(A). The gate line extending from the scan driver has a two-layer structure constituted by the first gate line 202 and the second gate lines 221 and 222. However, the second gate lines are not provided in the portion 226 where the source and gate lines intersect with each other. The first and second gate lines are connected at contacts 223 and 224. The active matrix circuit in the present embodiment has two contacts for one TFT.

With the arrangement wherein the second gate line is not provided in the portion where the source and gate lines intersect with each other as in the present embodiment, as clearly seen at FIG. 3(I), the step formed at the intersection can be made small. This reduces the possibility of the breakage of the source line and contributes to improvement in the yield of the products.

Figure 5B:
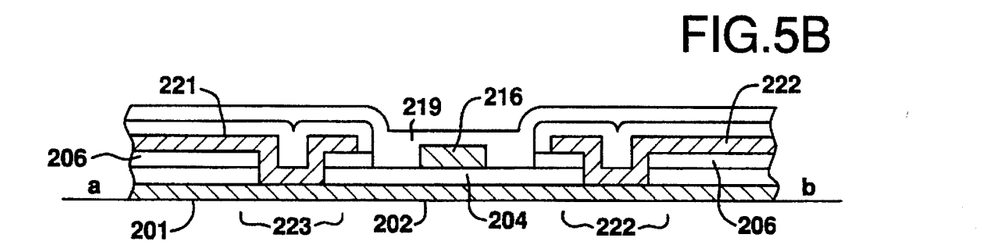
Figure 5C:
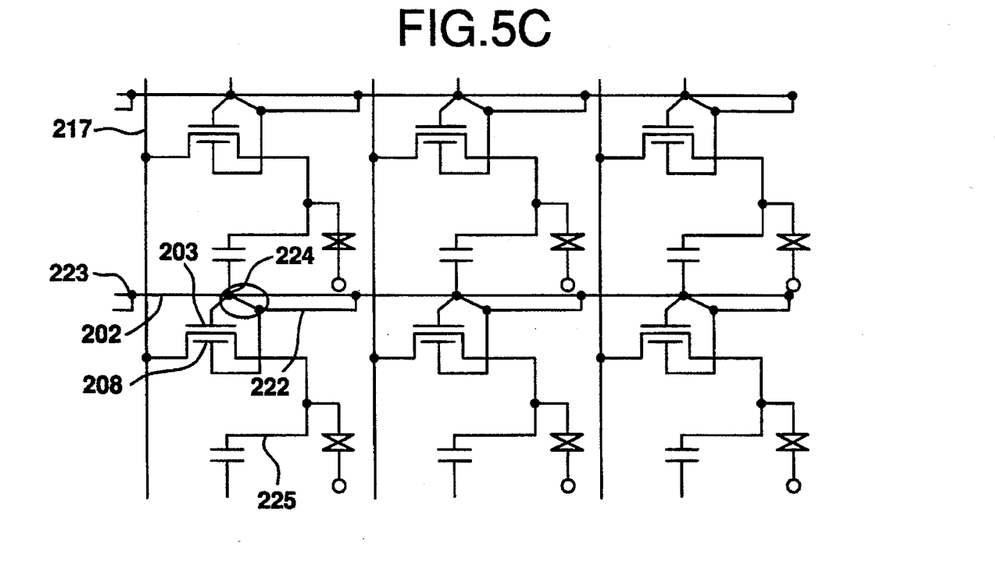

There is shown at FIG. 5(B) a sectional structure of the gate lines along the line a-b at FIG. 5(A). A circuit diagram of a matrix obtained by arranging a plurality of the circuits at FIG. 5(A) is shown at FIG. 5(C).

It is shown at FIG. 5(A) that the gate lines 222 and 202 are branched to a line 225 which extends under the pixel electrode for the row above the row associated with the gate lines to establish a capacity with the pixel electrode.

[Embodiment 3]

Figure 7A:
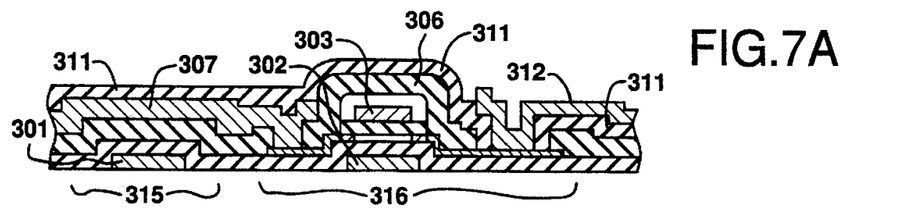
FIGS. 7(A) and 7(B) show the structure of a TFT circuit according to a third embodiment.
Figure 7B:
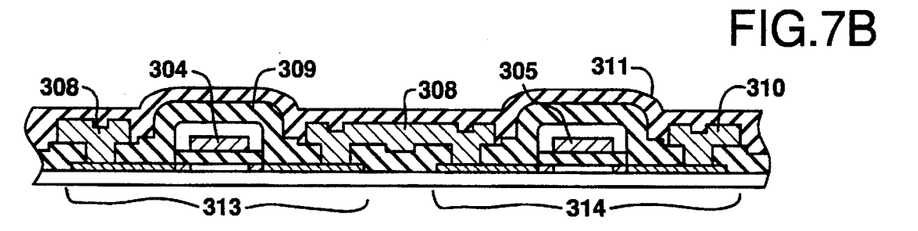

FIGS. 7(A) and 7(B) show a third embodiment of the present invention. There is shown at FIG. 7(A) a portion around transistors in an active matrix circuit. The area of a peripheral circuit is shown at FIG. 7(B). The present embodiment is characterized in that the TFTs in the active matrix circuit have the structure including upper and lower gate electrodes according to the invention while the TFTs in the peripheral circuit are top gate type TFTs. In order to obtain such a structure, first gate electrodes are provided only in the active matrix region. The present embodiment will now be described with reference to the drawings.

In the active matrix circuit region, first gate electrode/lines 301 and 302 are formed and a second gate electrode/line 303 covered with an anodic oxide is formed in portions except the portion where the first gate electrode 301 intersects with a third line 307 as in the second embodiment. In the present embodiment, a first insulating film (an insulating film between the first gate electrode 302 and the active layer) and a second insulating film (an insulating film between the second gate electrode 303 and the active layer) are both formed of silicon oxide and have thicknesses of 1200 Å and 1800 Å, respectively. Therefore, the functionality of this active matrix circuit is dependent more on the first gate electrode 302. The structures of the source/drain regions and silicide of the TFTs and are the same as those in other embodiments (see FIG. 7(A)).

In the peripheral circuit region, the first gate line/electrode is not provided and only the second gate line/electrodes 304 and 305 covered with an anodic oxide are provided. Although the first and second gate insulating films have different thicknesses as described above, the effect of the difference can not be observed in the peripheral circuit where the first gate electrode is not provided (see FIG. 7(B)).

A first interlayer insulator 306 is formed using a 2000 Å thick silicon nitride film so that it covers the second gate line/electrodes 303, 304, and 305. Then, contact holes are formed in the first interlayer insulator 306. The contact holes are formed to connect to not only a source line (third line) 307 but also a pixel electrode 312 in a TFT of the active matrix circuit.

Thereafter, third lines 307 to 310 are formed. These lines are formed using multi-layer films constituted by a layer of titanium (having a thickness of 500 Å) and a layer of aluminum (having a thickness of 4000 Å). The aluminum includes 1% silicon (see FIG. 7(A) and 7(B)).

A second interlayer insulator 311 is formed using a 3000 Å thick silicon oxide film. A contact hole is formed in the portion of the active matrix circuit wherein the pixel electrode and TFTs contact with each other. This contact hole is formed inside the contact hole which has been previously formed. Finally, a pixel electrode 312 is provided (see FIG. 7(B)).

Thus, a TFT 316 and a line intersection 315 of the active matrix circuit, and an N-channel type TFT 313 and a P-channel type TFT 314 of the peripheral circuit are completed.

[Embodiment 4]

Figure 8A:
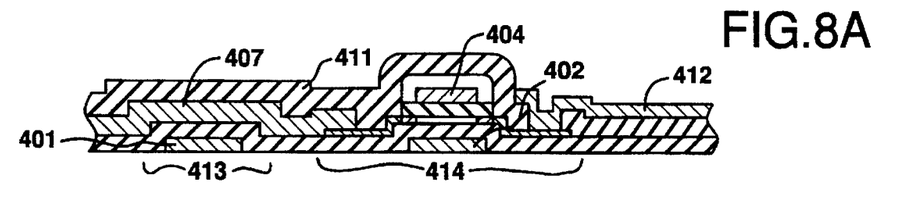
FIGS. 8(A) and 8(B) show the structure of a TFT circuit according to a fourth embodiment.
Figure 8B:
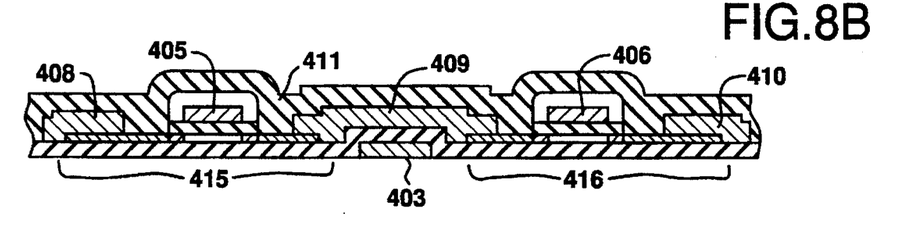

FIGS. 8(A) and 8(B) show a fourth embodiment of the present invention. There is shown at FIG. 8(A) a portion around transistors in an active matrix circuit. The portion of a peripheral circuit is shown at FIG. 8(B). The present embodiment has a structure wherein TFTs in the peripheral circuits are top gate type TFTs as in the third embodiment; first gate lines are left in the peripheral circuit region; and the first and third lines intersect with each other at a line intersection. The present embodiment will now be described with reference to the drawings.

In the active matrix circuit region, first gate electrode/lines 401 and 402 are formed and a second gate electrode/line 404 covered with an anodic oxide is formed in portions except the portion where the first gate electrode 401 intersects with a third line 407 as in the second embodiment. In the present embodiment, a first insulating film (an insulating film between the first gate electrode 402 and the active layer) and a second insulating film (an insulating film between the second gate electrode 404 and the active layer) are both formed using a silicon nitride film and a silicon oxide film, respectively. The former has a thickness of 4000 Å and the latter has a thickness of 1200 Å. The first and second gate electrodes have the same effect if their dielectric constants are taken into consideration. Structure of source/drain regions and a silicide region are the same as in other embodiment (see FIG. 8(A)).

In the peripheral circuit region, the first gate electrode is not provided in the portion of the TFTs and but is provided in other portions. While the second gate line/electrodes 405 and 406 covered with an anodic oxide are provided in the portion of the TFTs, the second gate line is not provided on the portion where the first line and a third line 409 intersect with each other. The purpose is to make the step formed by those lines small as in the second embodiment (see FIG. 8(B)).

Third lines 407 to 410 are formed. At this time, the first gate lines 401 and 403 in the active matrix circuit and the peripheral circuit are separated from the third lines 408 and 409 by the first insulating film formed on the first gate lines, for interlayer separation (see FIG. 8(A) and (B)).

An interlayer insulator 411 is then formed using a 3000 Å thick silicon nitride film. A contact hole is formed in the portion of the active matrix circuit wherein the pixel electrode and TFTs contact with each other, and a pixel electrode 412 is provided (see FIG. 8(B)).

Thus, a TFT 414 and a line intersection 413 of the active matrix circuit, and an N-channel type TFT 415 and a P-channel type TFT 416 of the peripheral circuit are completed.

The advantages of the present invention as described above will be summarized below.

The first advantage is that the resistance of the gate lines can be reduced by employing a two-layer structure for the gate lines. The second advantage is that failures caused by the breakage of gate lines can be reduced by employing a two-layer structure for the gate lines. The third advantage is that the sheet resistance of a TFT can be reduced by providing a silicide region adjacent to the source/drain region.

TFTs of the present invention may be similarly formed to constitute a three-dimensional integrated circuit on a substrate on which a semiconductor integrated circuit is formed and may be formed on glass, organic resin or the like. The TFTs of the present invention are characterized in that they are formed on an insulating surface in any case. The present invention is significantly advantageous especially for electro-optical devices such as monolithic active matrix circuits which include peripheral circuits on the same substrate.

It will be understood that the present invention is advantageous from an industrial point of view.

What is claimed is:

1. An electro-optical device comprising:
   a substrate having an insulating surface;
   a first gate line and a second gate line extending in parallel on said substrate;
   an interlayer insulator interposed between said first and second gate lines;
   a plurality of pixel regions arranged in parallel with said first and second gate lines;

a thin film transistor disposed in each of said pixel regions on said substrate, said transistor having a first gate electrode, a first gate insulating layer on said first gate electrode, a semiconductor layer including a channel region on said first gate insulating layer, a second gate insulating layer on said semiconductor layer and a second gate electrode on said second gate insulating layer, where said first gate electrode is electrically connected to said first gate line and said second gate electrode is electrically connected to said second gate line, wherein said first gate line is connected with said second gate line through a contact hole of said interlayer insulator at each of said pixel regions.

2. The electro-optical device of claim 1 wherein said first gate line and said second gate line are coextensive to each other.

3. The electro-optical device of claim 1 wherein said second gate electrode comprises an anodizable material and is coated with an anodic oxide film of said anodizable material.

4. An electro-optical device comprising:

a substrate having an insulating surface;

a first gate line and a second gate line extending in parallel on said substrate;

an interlayer insulator interposed between said first and second gate lines;

a plurality of pixel regions arranged in parallel with said first and second gate lines;

a thin film transistor disposed in each of said pixel regions on said substrate, said transistor having a first gate electrode, a first gate insulating layer on said first electrode, a semiconductor layer including a channel region on said first gate insulating layer, a second gate insulating layer on said semiconductor layer and a second gate electrode on said second gate insulating layer, where said first gate electrode extends from said first gate line and said second gate electrode extends from said second gate line, wherein said first gate line comprises a heat resistant material and said second gate line comprises an anodizable material.

5. The electro-optical device of claim 4 wherein said first gate line comprises a material selected from the group consisting of doped semiconductor, W, Mo, and Ti.

6. The electro-optical device of claim 4 wherein said second gate line comprises a material selected from the group consisting of Al, Ti, and Ta.

7. The electro-optical device of claim 4 wherein said channel region is intrinsic.

8. The electro-optical device of claim 4 wherein said heat resistant material of said first gate line remains functional as a gate line following thermal annealing at a temperature of 500° C. to 600°C.

9. An electro-optical device comprising:

a substrate having a pixel area and a peripheral circuit area;

a first plurality of thin film transistors disposed in said pixel area on said substrate for switching pixels; and a second plurality of thin film transistors disposed in said peripheral circuit area on said substrate for constituting a drive circuit, each of said first and second plurality of thin film transistors comprising source and drain semiconductor regions, a channel semiconductor region between said source and drain semiconductor regions and a gate means adjacent to said channel semiconductor region, wherein the gate means of the first plurality of thin film transistors comprises a first gate electrode and a second gate electrode adjacent to upper and lower surfaces of the associated channel semiconductor region, and the gate means of the second plurality of thin film transistors comprises a gate electrode adjacent to only one side of said channel semiconductor region.

10. The electro-optical device of claim 9 wherein said first gate line comprises a material selected from the group consisting of doped semiconductor, W, Mo, and Ti.

11. The electro-optical device of claim 9 wherein said second gate line comprises a material selected from the group consisting of Al, Ti, and Ta.

12. The electro-optical device of claim 9 wherein said channel semiconductor region is intrinsic.

13. An electro-optical device comprising:

a substrate;

a plurality of pixel electrodes on said substrate;

a thin film transistor provided at each of said pixel electrodes, said thin film transistor comprising a first gate electrode, a first gate insulating layer on said first gate electrode, a semiconductor layer comprising silicon including source, drain, and channel regions formed on said first gate insulating layer, a second gate insulating layer on the semiconductor layer, and a second gate electrode on the second gate insulating layer, wherein said first gate electrode extends beyond side edges of said channel region and said second gate electrode is provided with an anodic oxide layer of a material of said second gate electrode.

14. The electro-optical device of claim 13 wherein said source and drain regions are provided with an alloy of silicon having a sheet resistance of 1000 $\Omega/\square$ or less.

15. The electro-optical device of claim 13 wherein said source and drain regions are provided with a metal silicide.

16. The electro-optical device of claim 13 wherein said first gate electrode comprises a material selected from the group consisting of doped semiconductor, W, Mo, and Ti.

17. The electro-optical device of claim 13 wherein said second gate electrode comprises a material selected from the group consisting of Al, Ti, and Ta.

18. The electro-optical device of claim 13 wherein said channel region is intrinsic.

* * * * *